United States Patent
Mertol

[19]

[11] Patent Number: 5,898,571
[45] Date of Patent: Apr. 27, 1999

[54] APPARATUS AND METHOD FOR CLIP-ON ATTACHMENT OF HEAT SINKS TO ENCAPSULATED SEMICONDUCTOR PACKAGES

[75] Inventor: Atila Mertol, Cupertino, Calif.

[73] Assignee: LSI Logic Corporation, Milpitas, Calif.

[21] Appl. No.: 08/847,706

[22] Filed: Apr. 28, 1997

[51] Int. Cl.⁶ ................................. H05K 7/20
[52] U.S. Cl. ................ 361/704; 361/705; 361/707; 361/709; 257/706; 257/712; 257/717; 257/718; 257/719; 257/687
[58] Field of Search ................... 361/704, 707, 361/709, 711, 712, 687, 717, 1, 719, 722; 257/706, 707, 718, 719, 722, 727, 787; 174/16.3; 165/80.3, 185

[56] References Cited

U.S. PATENT DOCUMENTS

| | | |
|---|---|---|
| 3,305,004 | 2/1967 | Barlowe . |
| 3,377,524 | 4/1968 | Bock et al. . |
| 4,235,285 | 11/1980 | Johnson et al. . |
| 4,323,914 | 4/1982 | Berndlmaier . |
| 4,481,525 | 11/1984 | Calabro et al. . |
| 4,607,685 | 8/1986 | Mitchell, Jr. . |
| 4,716,494 | 12/1987 | Bright . |
| 4,764,847 | 8/1988 | Eisenblatter et al. . |

(List continued on next page.)

FOREIGN PATENT DOCUMENTS

| | | |
|---|---|---|
| 59-44854 | 3/1984 | Japan . |
| 59-65457 | 4/1984 | Japan . |
| 60-41246 | 3/1985 | Japan . |
| 63-293958 | 11/1988 | Japan . |
| 1-57738 | 3/1989 | Japan . |
| 1-286455 | 11/1989 | Japan . |
| 2-82560 | 3/1990 | Japan . |
| 2-203555 | 8/1990 | Japan . |
| 2-205347 | 8/1990 | Japan . |
| 2-2461142 | 10/1990 | Japan . |
| 2-246142 | 10/1990 | Japan . |
| 4-116853 | 4/1992 | Japan . |
| 4-186752 | 7/1992 | Japan . |
| 5-13629 | 1/1993 | Japan . |
| 5-267485 | 10/1993 | Japan . |
| 6-120366 | 4/1994 | Japan . |

OTHER PUBLICATIONS

IBM Technical Disclosure Bulletin, vol. 28, No. 12 May 1986, pp. 5172–5173.

*Primary Examiner*—Leo P. Picard
*Assistant Examiner*—Boris L. Chervinsky

[57] ABSTRACT

An encapsulated semiconductor package assembly including a substrate, a die operatively disposed on the substrate, a lid for support by the substrate over the die, a heat sink operatively on the lid and a releasable clip which clips the heat sink releasably to the lid. With the encapsulant over the die but not yet solidified, the lid is pressed down into the encapsulant and onto the substrate. Thereby when the encapsulant is cured the lid is held in place on the substrate. The clip clips onto a lip or a slot of the lid to releasably hold a heat sink on the lid for dissipating heat from the die. The lip can be formed by an overhanging portion of the lid, and the slot can be formed in a side wall of the lid.

11 Claims, 6 Drawing Sheets

5,898,571
Page 2

U.S. PATENT DOCUMENTS

| | | |
|---|---|---|
| 5,003,429 | 3/1991 | Baker . |
| 5,057,903 | 10/1991 | Olla . |
| 5,089,936 | 2/1992 | Kojima . |
| 5,172,301 | 12/1992 | Schneider . |
| 5,175,612 | 12/1992 | Long et al. . |
| 5,182,632 | 1/1993 | Bechtel . |
| 5,208,731 | 5/1993 | Blomquist . |
| 5,227,663 | 7/1993 | Patil et al. ............................... 257/718 |
| 5,230,759 | 7/1993 | Hiraiwa . |
| 5,280,409 | 1/1994 | Selna . |
| 5,304,735 | 4/1994 | Earl . |
| 5,311,060 | 5/1994 | Rostoker et al. . |
| 5,329,426 | 7/1994 | Villani ..................................... 361/719 |
| 5,384,940 | 1/1995 | Soule . |
| 5,386,144 | 1/1995 | Variot et al. . |
| 5,386,342 | 1/1995 | Rostoker . |
| 5,397,919 | 3/1995 | Tata et al. . |
| 5,455,462 | 10/1995 | Marrs . |
| 5,521,439 | 5/1996 | Casati et al. ............................ 257/718 |
| 5,525,835 | 6/1996 | Nishiguchi . |
| 5,548,482 | 8/1996 | Hatauchi et al. ....................... 361/720 |
| 5,552,634 | 9/1996 | Schneider . |
| 5,552,635 | 9/1996 | Kim . |
| 5,596,485 | 1/1997 | Glenn . |
| 5,610,442 | 3/1997 | Schneider et al. . |
| 5,615,086 | 3/1997 | Collins . |
| 5,619,399 | 4/1997 | Mok . |
| 5,621,615 | 4/1997 | Dawson . |
| 5,625,222 | 4/1997 | Yoneda . |
| 5,642,265 | 6/1997 | Bond . |
| 5,691,041 | 11/1997 | Frankeny . |
| 5,786,631 | 7/1998 | Fishley et al. ......................... 257/701 |
| 5,789,813 | 8/1998 | Kirkland et al. ....................... 257/712 |

APPARATUS AND METHOD FOR CLIP-ON ATTACHMENT OF HEAT SINKS TO ENCAPSULATED SEMICONDUCTOR PACKAGES

BACKGROUND OF THE INVENTION

The present invention relates to methods and constructions for releasable clip-on attaching of heat sinks to encapsulated semiconductor packages.

Heat is generated during the operation of integrated circuit devices. In some instances, the heat generated is severe enough to irreparably damage or even destroy the device unless it is dissipated to the surrounding environment. Continuing advances in the number of transistors and other functional elements contained in a single integrated circuit and the increasingly higher speeds at which integrated circuits now operate, both contribute to the problem of integrated circuit heat generation.

Different heat sink constructions have thus been developed for removing at least some of the heat from integrated circuit devices. These heat sinks often are unitary structures having a heat transferring portion proximate to the semiconductor device for extracting heat therefrom and a heat dissipating portion remote from the die and with a large surface for dissipating heat from the heat transferring portion. The dissipating portion is typically formed with a number of parallel (often vertical) layers, through which air passes or is passed to remove heat from the heat sink.

In other words, heat sinks are used to maintain the temperatures of semiconductor device junctions within acceptable limits. Unfortunately, there is no clean and easy way to attach heat sinks on encapsulated packages. Since the top surfaces of encapsulated packages do not have a uniform thickness, direct heat sink attachment without any modification in the heat sink base cannot be done as a practical matter.

One prior art method is to have a picture-framed recessed cavity in the heat sink base and to use epoxy to attach the heat sink to the encapsulant. Thereby the epoxy not only bonds the heat sink to the package, but also provides thermal enhancement by filling the heat sink cavity. In other words, the heat sink is directly epoxied to the top of the package. Another prior art method uses thermal grease to fill the cavity and then attaches the heat sink to the package with clips. However, using epoxy or thermal grease presents cleaning issues and therefore is not preferred for many applications.

The packages are mounted on a motherboard, typically by reflowing a solder ball array therebetween. They are mounted often with many other packages. When problems arise with one of the packages, that package usually needs to be removed from the underlying motherboard. This requires that heat be carefully directed to the solder balls under that package to reflow them. Special equipment is used to heat the solder balls, and this equipment is positioned on top of the package and either blows hot air or uses conduction heating. Since the heat sink has a high thermal capacitance, it is difficult to effectively heat and reflow the solder balls underneath the package with the heat sink mounted on the package, because the heat sink itself absorbs much of the applied heat. Thus, more heat needs to be applied, and this is time consuming and/or potentially injurious to the surrounding electronic components mounted on the same printed circuit board.

Alternatively, the heat sink can be removed from the package before the heat is applied to reflow the solder balls. However, this requires a means for attaching the heat sink to the top of the substrate such that the heat sink can be readily removed when desired. One such means is a spring clip which fits over the heat sink and onto edges of the substrate or the motherboard and has its tension adjusted by the user with a screw driver. Unfortunately, this may cause the sides of the package to bend up and warp.

SUMMARY OF THE INVENTION

Directed to remedying the problems in the prior art, disclosed herein is an improved means for releasably clip-on attaching a heat sink to an encapsulated semiconductor package. Pursuant to this invention a lid is pressed into the (Hysol) encapsulant covering the die before the encapsulant has cured, some of the encapsulant thereby being pushed out between the legs of the lid and onto outer surfaces of the lid. When the encapsulant cures the lid is thereby secured to the top of the substrate over the die.

The lid is configured like a tiny table with a top surface or plate and short legs depending down therefrom, preferably at the corners. Other leg configurations and placements are within the scope of the invention including at the centers of the sides and a continuous full length side wall. However, when it is a continuous side wall construction, openings need to be provided either in the top plate and/or through the side wall. The openings provide an escape path for the encapsulant gases. Additionally, the liquid encapsulant can ooze out or be pushed out the openings to secure the lid to the substrate when the encapsulant hardens, as mentioned above. The lid can also have a small plate or other protrusion centrally disposed on its bottom surface. This protrusion pushes the encapsulant out to better cover the wire bonds. It also positions the lid closer to the die to provide for more effective heat transfer.

The lid can have side walls depending a short distance down from the top plate and then the legs depend down from the side walls. According to one embodiment, the side walls are secured a distance inward from the edges of the top plate whereby the top plate overhangs the side walls forming a lip. Another embodiment does not have an overhanging configuration but instead has slots in the outer surfaces of the side walls. These slots are not through-holes but rather are surface grooves, so that the encapsulant cannot be pushed out through them from the inside of the lid to fill them as the lid is pushed down into position onto the encapsulant.

With the lid in position on the substrate and the encapsulant (preferably) cured, the heat sink can be attached to the lid on the top of the plate. It is attached using a spring clip, which is tightened into position using a screw driver. The clip is clipped into the slots or onto the lip, depending on the lid embodiment used. When desired, the heat sink can be removed by loosening the clip (from the slots or lips) using a screw driver, and the heat sink then lifted off of the lid. Since the lips can be provided on all four sides of the lid and the slots on all four of the side walls, this invention provides for different alternative orientations of the heat sink relative to the lid.

Other objects and advantages of the present invention will become more apparent to those persons having ordinary skill in the art to which the present invention pertains from the foregoing description taken in conjunction with the accompanying drawings.

DETAILED DESCRIPTION OF PREFERRED EMBODIMENTS OF THE INVENTION

Figure 1:
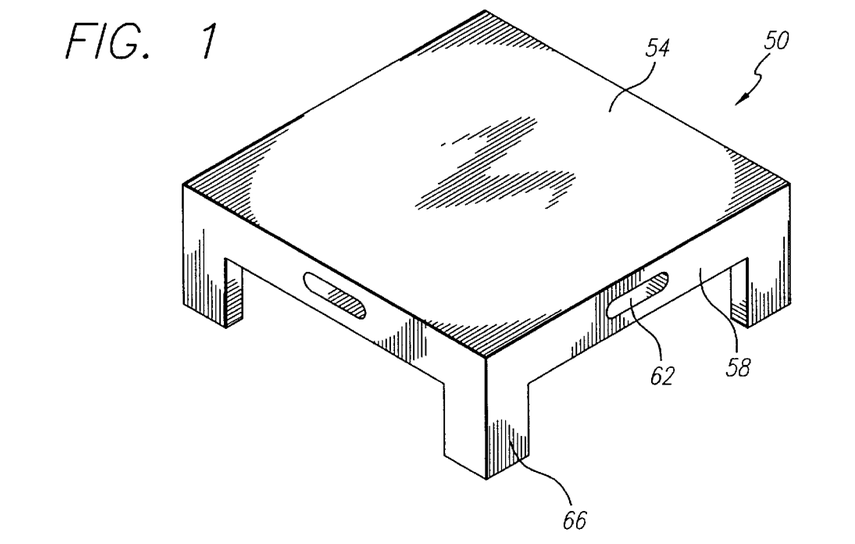
FIG. 1 is an enlarged perspective view of a heat sink support lid of the present invention.

Referring to FIG. 1, disclosed herein generally at 50 is a support lid of the present invention. Lid 50 includes a flat top plate 54, side walls 58, grooves or slots 62 in the side walls and legs 66 depending down from corners of the side walls. The lid 50 is very small, approximately 33.0 millimeters square and having a total height of only 2.1 millimeters. (These definitions are only illustrative, and would vary from package to package.) The lid 50 is formed of copper or aluminum stamped metal piece or other thermally conductive material.

Figure 2:
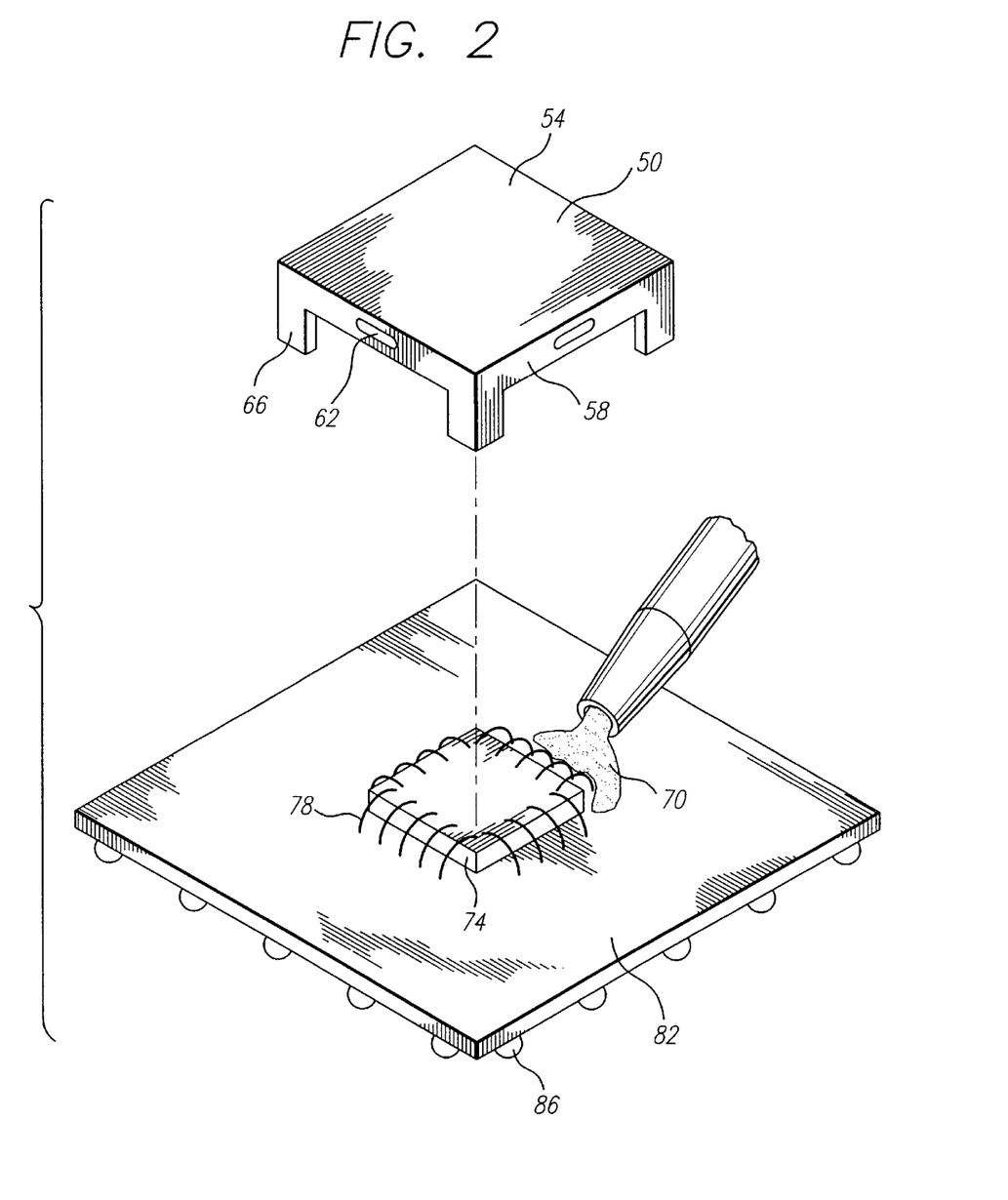
FIG. 2 is a perspective view of a semiconductor assembly of the present invention showing the encapsulant being deposited on the die and the lid of FIG. 1 subsequently being pressed down onto the encapsulant.
Figure 3:
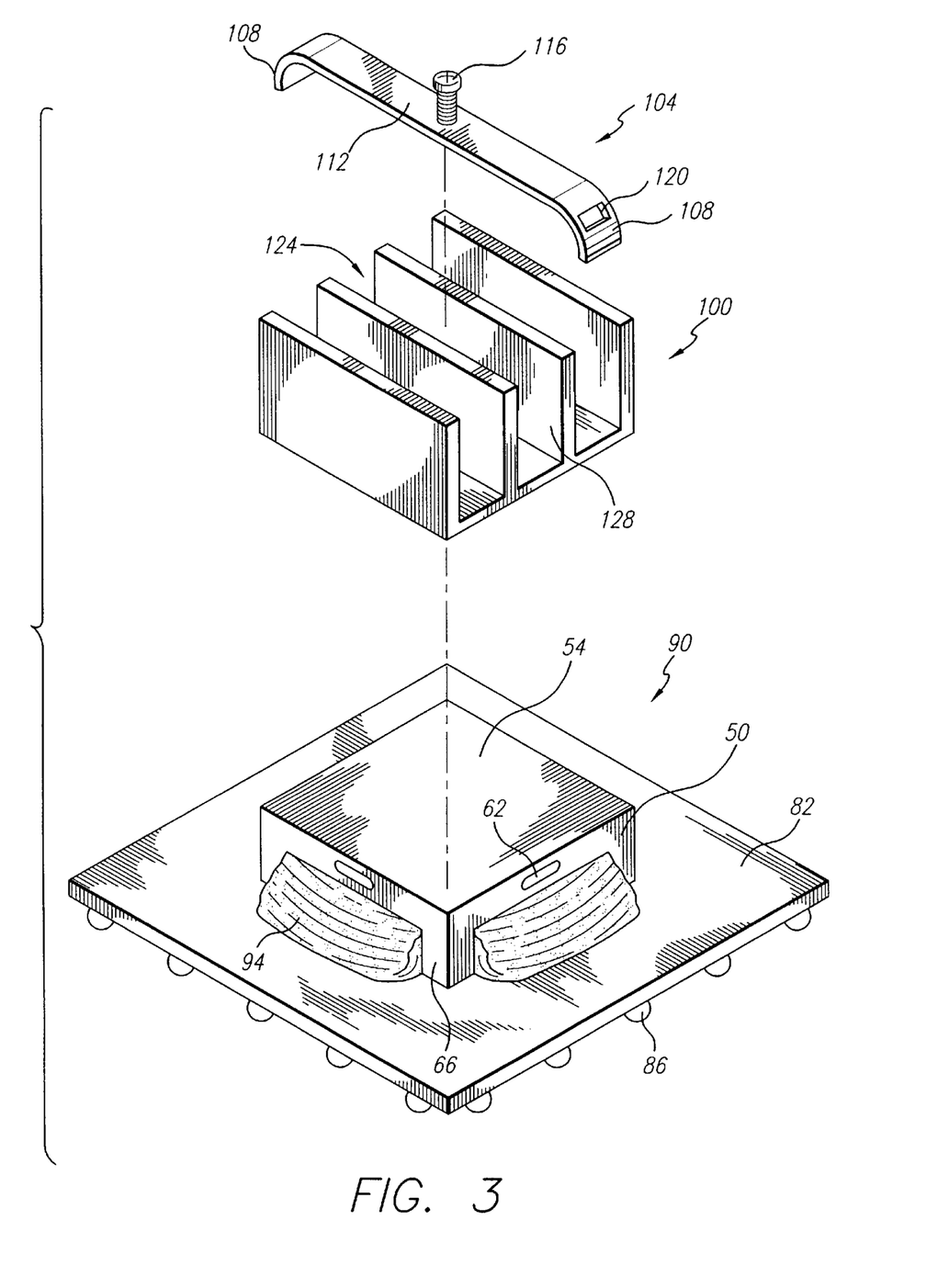
FIG. 3 is a perspective view of the assembly of FIG. 2 showing a heat sink being positioned down onto the lid.

The encapsulant 70 is shown in FIG. 2 being dispensed on a die 74, and wires 78 electrically bond the die to a substrate 82. A ball grid array 86 on the bottom of the substrate 82 is provided, as known in the art, for reflow attaching the encapsulated semiconductor package 90 to an underlying motherboard or circuit board. Although the package 90 is shown to be a ball grid array (BGA) package, this invention can be used on other packages, such as pin grid array packages, as would be apparent to those skilled in this art.

Before the encapsulant 70 has solidified or cured, the lid 50 is pressed down into the encapsulant, generally centered over the die 74 and the wires 78 and with the bottom ends of the legs 66 engaging on the top of the substrate 82. Some of the encapsulant 70 is thereby pushed or squeezed out the spaces between the legs as shown at 94 in FIGS. 3–9, and engages outer surfaces of the lid and especially the legs thereof. When the encapsulant 70 (and 94) solidifies, the lid 50 is secured to the substrate 82. The die 74 and wires 78 are also protectively enclosed by the encapsulant 70 as depicted in FIG. 6.

Figure 4:
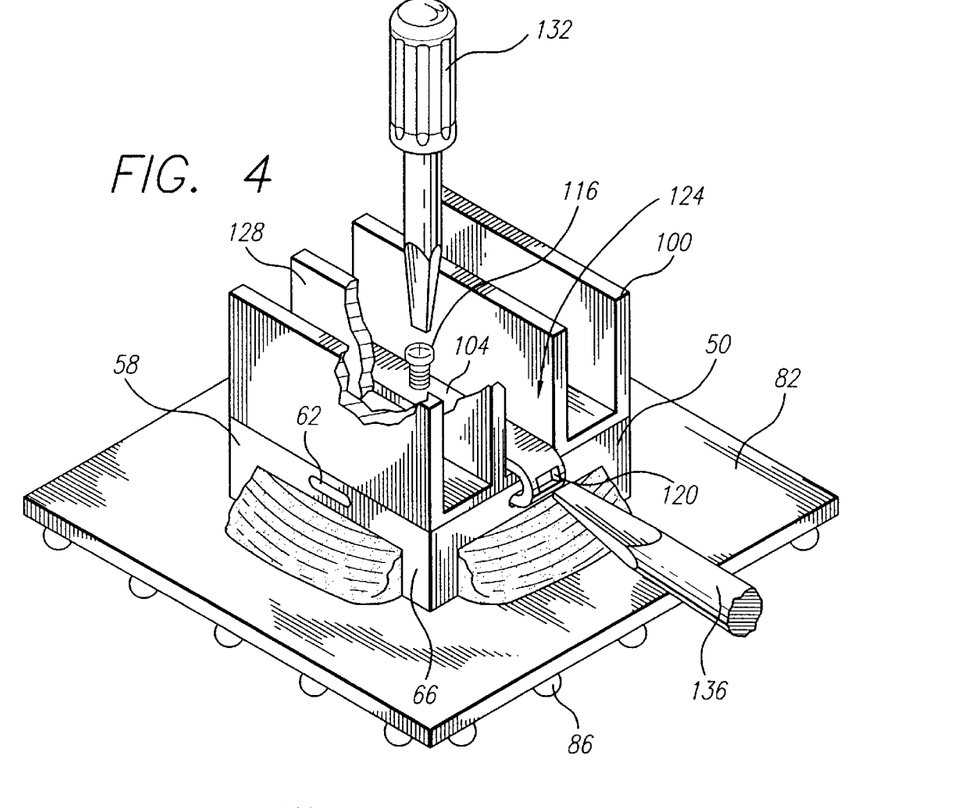
FIG. 4 is a perspective view of the assembly of FIG. 3 showing the heat sink being clipped into position on the lid and having portions thereof broken away for illustrative purposes.
Figure 5:
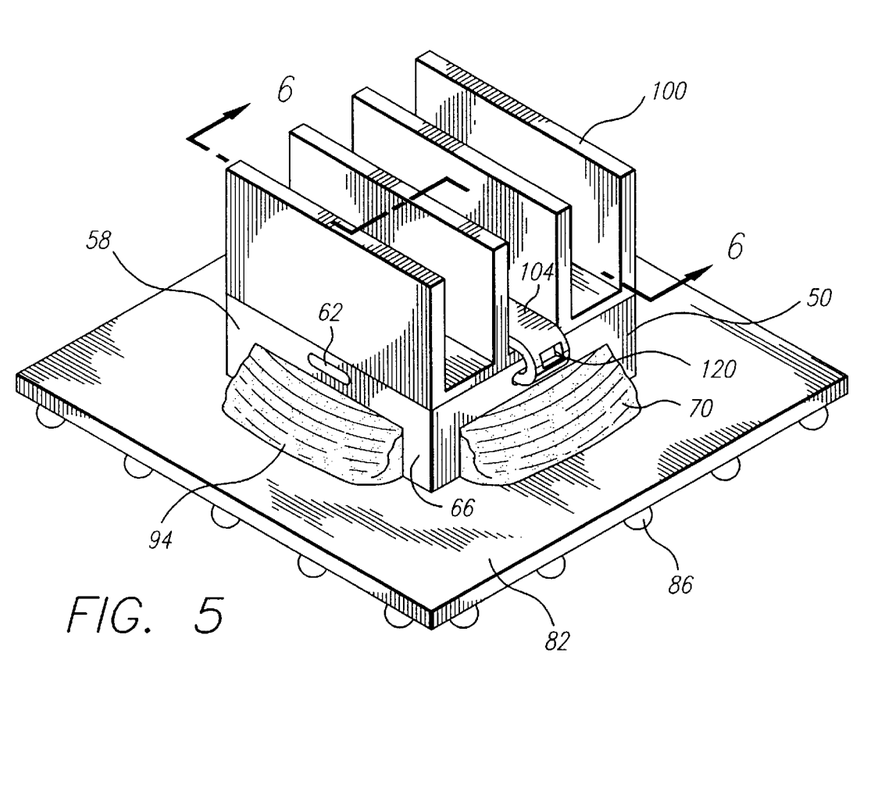
FIG. 5 is an enlarged perspective view of the assembly of FIG. 4 after the heat sink has been clipped into position.
Figure 6:
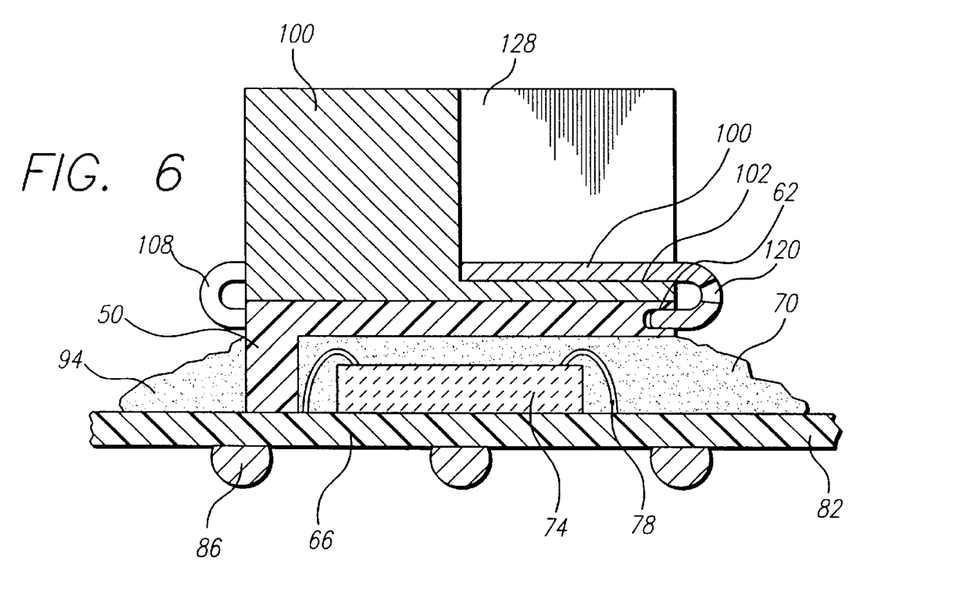
FIG. 6 is an enlarged cross-sectional view taken on line 6—6 of FIG. 5.
Figure 7:
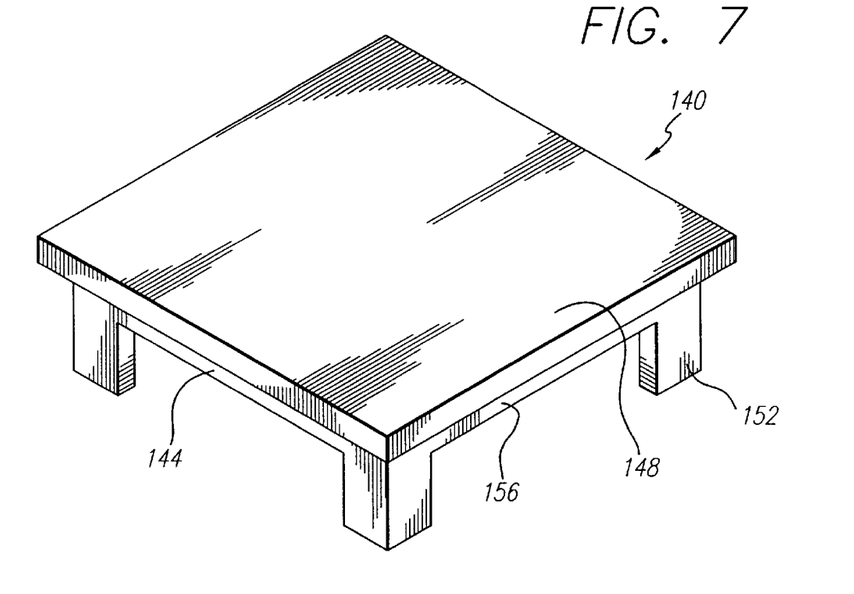
FIG. 7 is a perspective view similar to FIG. 1 of an alternative lid of the present invention.

The surface of the top plate 54 of the lid 50, which is affixed to the substrate 82, defines a flat mounting surface for a heat sink, such as that shown at 100 in FIGS. 3–6. To increase thermal conductance from the lid 50 to the heat sink 100, a layer of thermal grease 102, as shown in FIG. 6, can be applied between the top plate 54 and the bottom surface of the heat sink. Also shown in the drawings (and particularly FIG. 3) is a spring clamp or clip 104 having curved ends 108 at the ends of an elongate central portion 112, a tightening screw 116 at the center of portion 112, and a release opening 120 in one of the curved ends. These spring clamps 104 are available from Intricast Corp. of Santa Clara, Calif., for example. The central portion 112 is positioned down in a channel 124 defined between adjacent central fins 128 of the heat sink 100. With the heat sink 100 on the flat top plate 54 and the curved ends 108 in opposing slots 62, the screw 116 is tightened; it is tightened with a screw driver 132 as shown in FIG. 4.

The slots 62 are provided in all four sides of the lid 50. Thus, the heat sink 100 advantageously can be secured in any ninety degree orientation relative to the package 90. The slots 62 also do not extend all of the way through the side walls 58, because if they did the encapsulant 70 will fill them, thereby closing or blocking them.

To release the heat sink 100 from the lid 50, for reasons explained in the Background section of this disclosure, a screw driver 136 (or similar implement) is inserted in the release opening 120 as shown in FIG. 4 and pulled, to release that end from the slot 62. The spring clip 104 can them be manipulated and released from engagement in the opposing slot 62, and the heat sink 100 lifted off of the lid 50. In other words, lid 50 includes slots 62 for engaging the ends of the spring clip 104 when in place over the heat sink 100 and thereby releasably holding the heat sink in position relative to the package 90.

Figure 8:
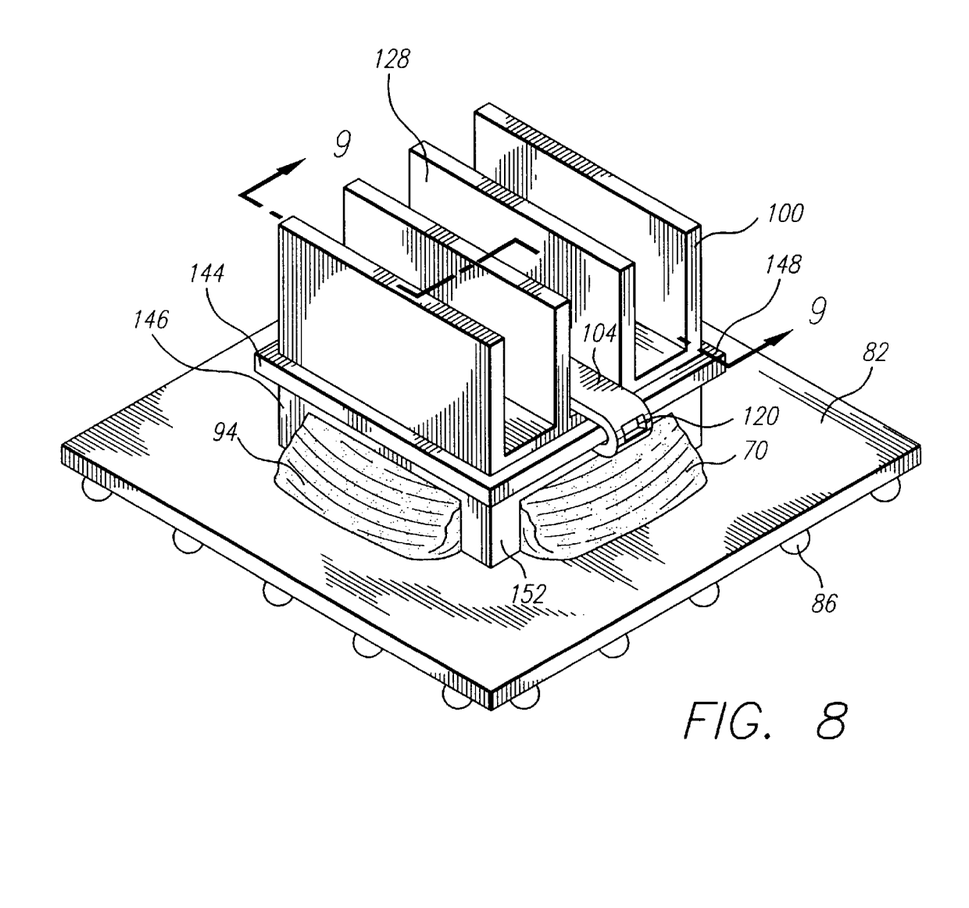
FIG. 8 is a perspective view similar to FIG. 5, but using the lid of FIG. 7.
Figure 9:
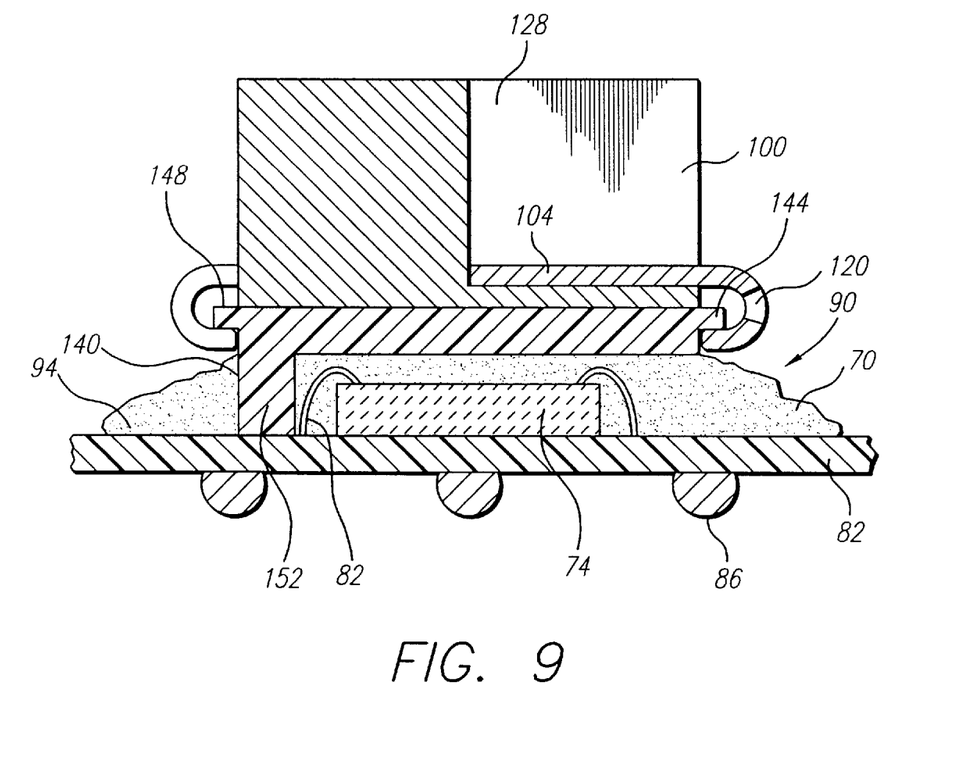
FIG. 9 is an enlarged cross-sectional view taken on line 9–9 of FIG. 8.

In contrast, the lid 140 of FIGS. 8 and 9 has a lip or overhang 144 on which the hook ends 108 of the spring clip 104 can engage (instead of slots 62). As shown, the lid 140 includes a top plate 148 which is large enough to overhang the legs 152 or the side walls 156 and legs, so that the edges of the top plate form the lip or overhang 144 about the entire perimeter of the lid.

Thus, the lid 140 (similar to lid 50) is pressed into the encapsulant 70 before curing into place over the die 74. The encapsulant 70 is allowed to harden thereby securing the lid 140 on the substrate 82. With the heat sink 100 on the top surface of the top plate 148 of the lid 140, the clip 104 in the channel 124 between adjacent fins 128 and the spring clip ends 108 hooked over the lips 144, the screw 116 is tightened and the heat sink 100 is thereby secured to the package 90. The releasing process for lid 140 is the same as that described previously for lid 50.

Another design of a heat sink which can be used herein includes the heat sink being longer than the lid to thereby have additional heat dissipating area. The heat sink would thereby overhang the edges of the lid. When the spring clip is tightened down it would pull down on the edges of the heat sink causing them to bend or warp down and the center of the heat sink to lift off of the lid. This reduces the thermal conductance to the heat sink. Also, this long heat sink may prevent the spring clips from engaging effectively in the slots or on the lips.

Thus, the alternative "long" heat sink design of this invention provides notches in the floor of the heat sink in the channel at the ends thereof, the notches extending preferably back to the edges of the lid. Thereby, this heat sink will not interfere with effective engagement of the clip in the slots or on the lips. Also, there will be no overhang which the spring clip pulls down on.

In other words, the lids 140, 50 serve three functions. First, they provide a solid flat and stable mounting surface for the heat sink, and in alternative orientations relative to the package. Second, by their manufacture of high thermal conductivity material and their proximate positioning next to the die 74, they efficiently channel the heat from the die to the heat sink 100 for effective dissipation via the heat sink fins 128. Third, the slots 62 and the lips 144 of these lids 50, 140 provide convenient and efficient structure in which the ends 108 of the spring clip 104 can be engaged and disengaged for securing the heat sink 100 to the package 90 and easy releasing it therefrom. This securement does not place any stress on the edges of the substrate 82 or package 90. Also, it does not interfere with the solder balls 86 and more solder balls can be added and positioned at the edge of the package, such as in today's new large package designs where the traces or lines run close to the edge.

From the foregoing detailed description, it will be evident that there are a number of changes, adaptations and modifications of the present invention which come within the province of those skilled in the art. However, it is intended that all such variations not departing from the spirit of the invention be considered as within the scope thereof as limited solely by the claims appended hereto.

What is claimed is:

1. A semiconductor package assembly, comprising:
   a substrate;
   a die operatively disposed on said substrate;
   a lid attached to said substrate, said lid comprising:
      at least one opening;
      a top plate that covers said die, said top plate having a substantially flat top surface; and
      at least two support legs attached to said substrate such that at least one of said at least one openings is disposed between and thereby defined by two of said support legs;
   a heat sink mounted on the top surface of said top plate;
   a releasable clip which clips said heat sink releasably to said lid, the clip engaging said lid; and
   encapsulant covering said die and securing said lid to said substrate.

2. The assembly of claim 1 wherein said lid includes a lip onto which said clip can operatively engage.

3. The assembly of claim 2 wherein said lip is on one side of said lid, and each of the other sides of said lid has a respective lip onto which said clip can operatively engage.

4. The assembly of claim 3 wherein;
   said lid includes side members;
   said top plate comprises edges; and
   said top plate is disposed of said side members such that the edges of said top plate overhang said side members and thereby define said lips.

5. The assembly of claim 4 wherein said at least two support legs depend down from said side members.

6. The assembly of claim 1 wherein said lid includes a slot in which said clip can operatively engage.

7. The assembly of claim 6 wherein said slot is on one side of said lid and at least one other side of said lid includes another slot in which said clip can alternatively engage.

8. The assembly of claim 6 wherein said lid includes side surfaces and said slot is on one of said side surfaces.

9. The assembly of claim 8 wherein said slot penetrates only part way into said side surface.

10. The assembly of claim 8 wherein said at least two support legs depend down from said side surfaces.

11. The assembly of claim 1 wherein said heat sink has a footprint on said substrate substantially smaller than length and width dimensions of said substrate.

* * * * *